United States Patent [19]
Fischer et al.

[11] Patent Number: 5,894,283
[45] Date of Patent: *Apr. 13, 1999

[54] METHOD AND APPARATUS FOR CONVERTING ANALOG SIGNALS INTO PULSE SIGNALS WITH SIMULTANEOUS ANALOG SIGNAL COMPRESSION

[75] Inventors: Matthew J. Fischer, Mountain View; Eugen Gershon, San Jose, both of Calif.

[73] Assignee: Advanced Micro Devices, Inc., Sunnyvale, Calif.

[*] Notice: This patent is subject to a terminal disclaimer.

[21] Appl. No.: 08/826,587

[22] Filed: Apr. 3, 1997

[51] Int. Cl.$^6$ .................................................. H03M 1/38
[52] U.S. Cl. .................................... 341/161; 341/157
[58] Field of Search ........................ 341/167, 172, 341/157, 155, 161, 165

[56] References Cited

U.S. PATENT DOCUMENTS

| | | | |
|---|---|---|---|
| 3,729,732 | 4/1973 | Yano | 341/118 |
| 3,742,489 | 6/1973 | Lefevre et al. | 340/347 |
| 3,842,413 | 10/1974 | Lagarde | 340/347 |
| 4,091,380 | 5/1978 | Yu | 340/347 |
| 4,594,578 | 6/1986 | Walsh | 341/167 |
| 4,617,549 | 10/1986 | Reiner | 340/347 |
| 5,023,490 | 6/1991 | Gittinger | 307/492 |

*Primary Examiner*—Marc S. Hoff
*Assistant Examiner*—Peguy JeanPierre

[57] ABSTRACT

A circuit is provided to convert an analog signal into a pulse signal, and simultaneously compress the analog signal. The input analog signal buffered by a sample-and-hold circuit is supplied to a chain of amplifier stages having equal gains greater than 1. A set of comparators compares the output signal of each amplifier stage with a reference value. As soon as the output of any amplifier stage exceeds the reference value, a logical summing device coupled to the comparators causes a pulse signal produced by the conversion circuit to become active. A clock signal controls the sample-and-hold circuit to produce a zero level sample-and-hold signal that causes the pulse signal to become inactive. As the amplifier chain is arranged so as to increase its total gain for a lower level of the input analog signal with respect to its total gain for a higher level of the input analog signal, the conversion circuit compresses the input analog signal simultaneously with its conversion into the pulse signal.

20 Claims, 4 Drawing Sheets

TYPICAL WAVEFORMS
Figure 4A — ANALOG INPUT
Figure 4B — SAMPLE AND HOLD OUTPUT
Figure 4C — CLOCK, SAMPLE TIME, CONVERT TIME, CLOCK PERIOD
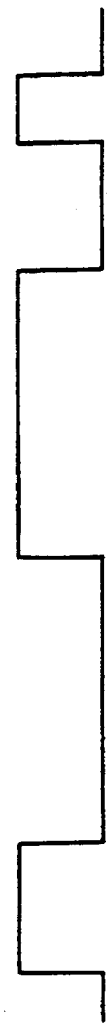
Figure 4D — PULSE_OUT

METHOD AND APPARATUS FOR CONVERTING ANALOG SIGNALS INTO PULSE SIGNALS WITH SIMULTANEOUS ANALOG SIGNAL COMPRESSION

TECHNICAL FIELD

The present invention relates to analog signal measurement and, more particularly, to a system that translates an input analog signal into a pulse signal, and simultaneously compresses the input signal.

BACKGROUND ART

For such applications as communication equipment, and electronic instruments, input signals are usually presented as analog waveforms. However, in systems based on pulse circuits, such as pulse analyzers, pulse communication systems or pulse-code modulation TV systems, input analog signals must be converted into pulse signals to allow complex signal analysis and processing to be carried out. To prevent weak signal components from being lost in background, and strong signal components from overloading the signal processing system, an analog signal may be compressed before its conversion into a pulse signal.

Various compression schemes have been developed to compress an analog signal before its conversion. For example, U.S. Pat. No. 5,023,490 to Gittinger of Jun. 11, 1991 discloses a circuit for performing a monotonic compression function over an AC signal before supplying the AC signal to a high-frequency analog-to-digital converter. The compression circuit comprises multiple limiter stages, each of which contains a wide-band cascode amplifier and current-mirror devices. Thus, the prior art arrangement requires separate circuits for carrying out analog signal compression and conversion procedures.

To reduce the number of components required to perform analog signal compression and conversion, it would be desirable to provide a single circuit that combines the conversion of an analog signal into a pulse signal with the compression of the analog signal.

Also, to increase the operating speed of a signal processing system, it would be desirable to provide a circuit that carries out the conversion of an analog signal into a pulse signal and the compression of the analog signal in a single step.

DISCLOSURE OF THE INVENTION

Accordingly, one advantage of the invention is in providing a single circuit that combines the conversion of an analog signal into a pulse signal with the compression of the analog signal.

Another advantage of the invention is in providing a circuit that carries out the conversion of an analog signal into a pulse signal and the compression of the analog signal in a single step.

The above and other advantages of the invention are achieved, at least in part, by providing a circuit for converting an input analog signal into a pulse signal, that comprises an amplifier having a plurality of amplifier stages responsive to the input analog signal. A comparator is coupled to outputs of the amplifier stages for comparing an output signal of each of the amplifier stages with a preset reference value. A pulse generator is coupled to outputs of the comparator for producing the pulse signal when the output signal of any of the amplifier stages exceeds the preset reference value. The amplifier stages are arranged so as to increase a gain of the amplifier for a lower level of the input analog signal with respect to the gain for a higher level of the input analog signal, to provide compression of the input analog signal.

In accordance with one aspect of the present invention, the amplifier stages are connected in series and have an equal gain greater than 1.

In accordance with another aspect of the invention, a sample-and-hold circuit is coupled to an input of the amplifier. The sample-and-hold circuit is controlled by a control signal to produce a sample-and-hold signal at a low level in a sample time period, and to produce the sample-and-hold signal corresponding to the input analog signal in a convert time period. The amplifier stages are arranged to sequentially amplify the sample-and-hold signal.

In accordance with a further aspect of the invention, the pulse generator may initiate generation of the pulse signal in the convert time period when the output signal of any of the amplifier stages exceeds the preset reference value. The pulse generator may terminate generation of the pulse signal in the sample time period when output signals of the amplifier stages are less than the preset reference value. The pulse generator may comprise a logical summing circuit including an OR gate having inputs connected to the outputs of the comparators.

In accordance with another aspect of the invention, the amplifier stages may be provided with reset inputs. The control signal supplied to the reset inputs may reset the output signals of the amplifier stages to a low level simultaneously with controlling the sample-and-hold circuit to produce the low level signal.

In accordance with a further aspect of the invention, the comparator may comprise a plurality of comparator units. A first input of each comparator unit is coupled to a reference voltage supply line for receiving a reference voltage, and a second input is coupled to an output of one of the amplifier stages. The pulse generator may be coupled to outputs of the comparator units to initiate generation of the pulse signal when the output signal of any of the amplifier stages exceeds a value of the reference voltage. Each of the comparator units may be supplied with an equal value of the reference voltage. Alternatively, the reference voltage supplied to each subsequent comparator unit may be reduced with respect to the reference voltage at preceding comparator units.

In accordance with a method of the present invention, the following steps are carried out:
supplying an analog signal to an amplifier composed of multiple amplifier stages arranged to provide sequential amplification of the analog signal,
producing a pulse signal when an output signal of any of the amplifier stages exceeds a preset reference value, and
arranging the amplifier so as to increase its gain for a lower level of the input analog signal with respect to the gain for a higher level of the input analog signal, to provide compression of the input analog signal simultaneously with its conversion into the pulse signal.

The analog signal may be controlled before supplying it to the amplifier, to produce a low level signal in a sample time period, and to produce a buffered version of the analog signal in a convert time period.

The pulse signal producing step may comprise the step of initiating generation of the pulse signal in the convert time period when the output signal of any of the amplifier stages exceeds the preset reference value, and the step of terminating generation of the pulse signal in the sample time period when output signals of the amplifier stages are less than the preset reference value.

The amplifier stages may be reset simultaneously with producing the low level signal in the sample time period.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIGS. 4A–4D are waveform diagrams that illustrate operations of the converter in FIG. 3.

BEST MODE FOR CARRYING OUT THE INVENTION

Although the invention has general applicability in the field of analog signal processing, the best mode for practicing the invention is based in part on the realization of a converter that translates input analog signals into pulse signals.

Figure 1:
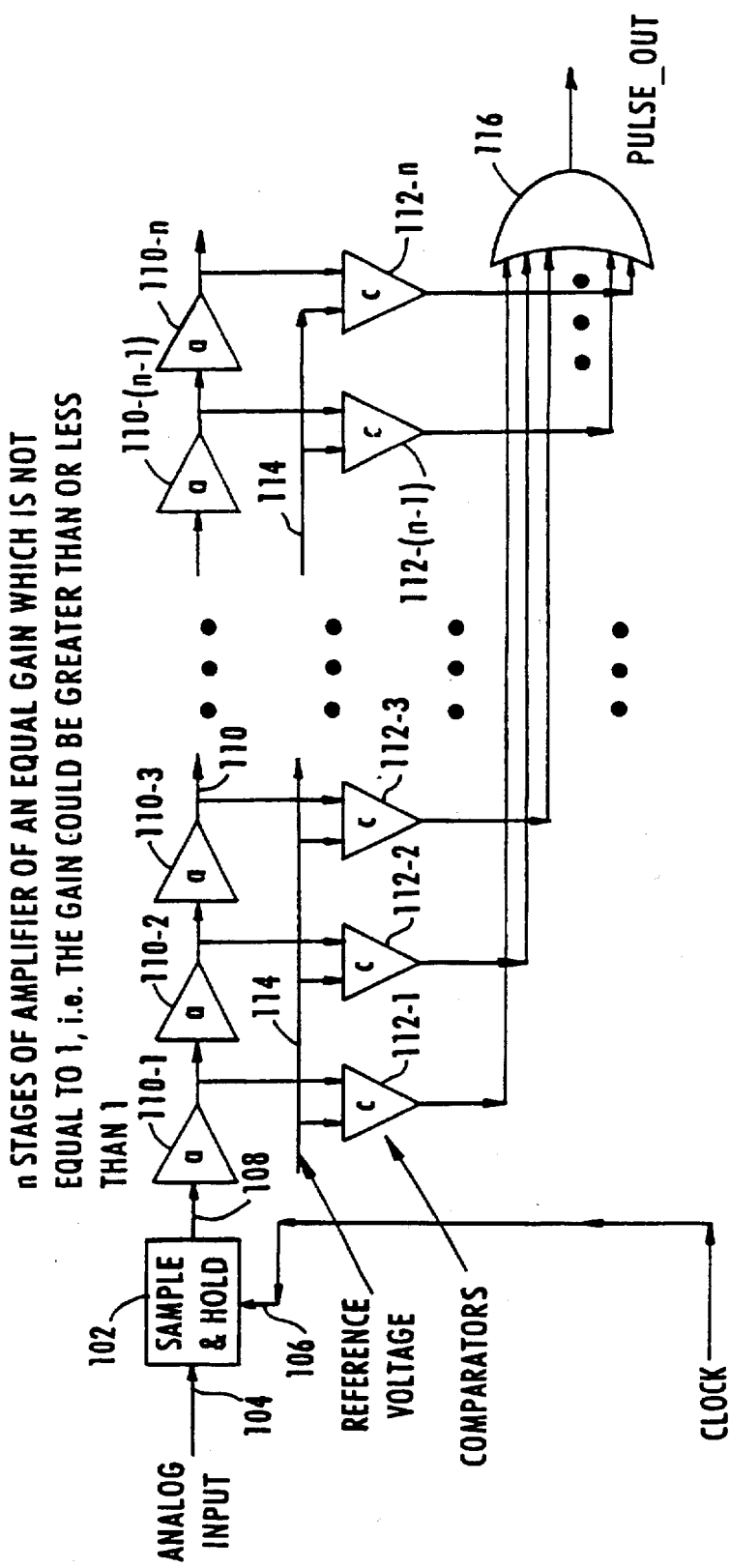
FIG. 1 is a diagram of an analog-to-pulse signal converter according to a first embodiment of the present invention.

Referring to FIG. 1, an analog-to-pulse signal converter 10 comprises a sample-and-hold circuit 102 having an input 104 supplied with an analog signal to be converted into a pulse signal. The sample-and-hold circuit 102 is supplied with an external clock signal via its control input 106 to produce a sample-and-hold output signal at its output 108. An amplifier chain 110 composed of n amplifier stages 110-1, 110-2, ..., 110-n is connected to the output 108. The amplifier stages in the chain 110 have equal gains that may be greater than 1 or less than 1. Each of the amplifier stages 110-1, 110-2, ..., 110-(n−1) has its output coupled to the input of the next amplifier stage.

The amplifier chain 110 is coupled to a set 112 of comparators 112-1, 112-2, ..., 112-n. One input of each comparator 112-1, 112-2, ..., 112-n is connected to the output of the amplifier stages 110-1, 110-2, ..., 110-n, respectively. Via a reference voltage line 114, another input of each comparator is supplied with a reference voltage provided by an external reference voltage source.

The outputs of the comparators are supplied to a logical summing device 116 that may be implemented by an OR gate having its inputs connected to outputs of all of the comparators 112-1, 112-2, ..., 112-n. The output of the OR gate 116 generates the output pulse signal produced by the analog-to-pulse signal converter 10.

Figure 2:
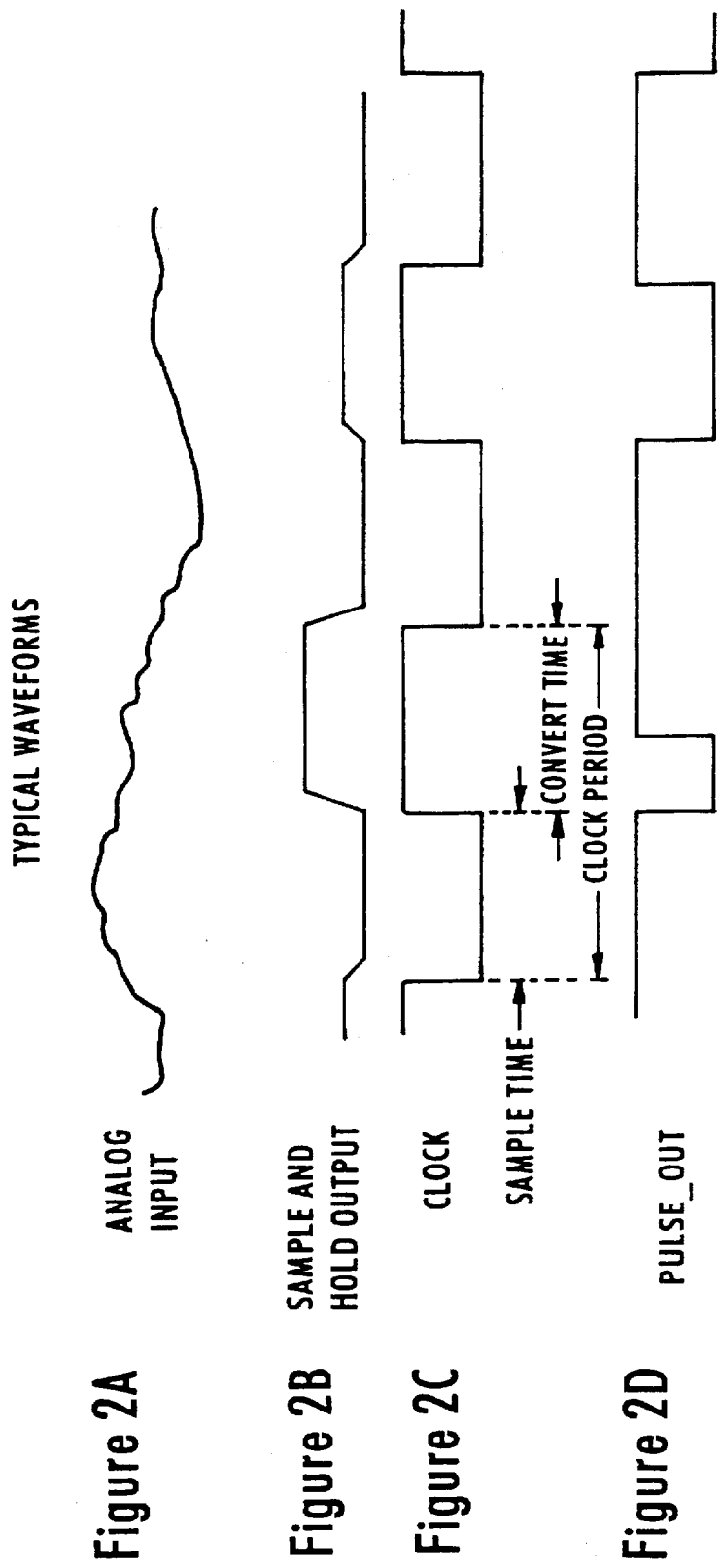
FIGS. 2A–2D are waveform diagrams that illustrate operations of the converter in FIG. 1.

Reference is now made to diagrams in FIGS. 2A–2D that show typical waveforms of signals in the analog-to-pulse signal converter 10. Via the input 104, an analog input signal (FIG. 2A) is supplied to the sample-and-hold circuit 102 that produces a sample-and-hold output signal (FIG. 2B). A clock signal (FIG. 2C) supplied via the control input 106 controls the sample-and-hold circuit 102 so as to sample the analog input signal for a period of time defined by the characteristics of the sample-and-hold circuit 102.

As shown in FIGS. 2B and 2C, the output of the sample-and-hold circuit 102 is held at a zero level during the sample time period set by the clock signal. When the clock signal (FIG. 2C) goes high to switch the converter 10 from the sample time period to the convert time period, the sample-and-hold circuit 102 produces a buffered version of the input signal at its output (FIG. 2B).

The sample-and-hold output signal supplied via the output 108 to the amplifier chain 110 propagates through the amplifier stages 110-1, 110-2, ..., 110-n having an equal gain. To provide the compression of the analog input signal, the gain of the amplifier stages 110-1, 110-2, ..., ,110-n should be greater than 1. However, analog-to-pulse signal conversion may be carried out even when the gain of the amplifier stages is less than 1, provided that the comparator inputs are reversed.

As the signal propagates through the amplifier chain 110, the output signal of each amplifier stage 110-1, 110-2, ..., 100-n is respectively supplied to each of the comparators 112-1, 112-2, ..., 112-n which compares the corresponding output signal with a pre-established reference value. Each comparator 112-1, 112-2, ..., 112-n may be supplied with the same reference value. Alternatively, the reference voltage supply line 114 may be arranged so as to provide the reference value at the subsequent comparator in the comparator set 112 less than the reference value at the preceding comparator. Thus, the reference value at the comparator 112-2 may be less than the reference value supplied to the preceding comparator 112-1. Similarly, the reference value at the next comparator 112-3 may be less than the reference value at the comparator 112-2, etc. Finally, the reference value at the comparator 112-n may be less than the reference value at the comparator 112-(n−1).

If the output signal at any amplifier stage 110-i exceeds the reference value supplied to the corresponding comparator 112-i, a logical 1 is produced at the output of the comparator 112-i indicating that the comparator 112-i becomes active. Alternatively, the comparator 112-i may be set to produce a logical 0 when the output signal of the amplifier stage 110-i exceeds the reference value supplied to the comparator 112-i.

The logical 1 output of the comparator 112-i (when i>1) causes the output of the OR gate 116 to go high to bring the pulse signal to an active state (FIG. 2D).

When enough time has passed to allow the output sample-and-hold signal (FIG. 2B) to propagate through all of the amplifier stages in the chain 110, the clock signal (FIG. 2C) is switched to its low level to initiate a new sample time period in the sample-and-hold circuit 102. During the sample time period, the sample-and-hold circuit 102 is controlled to produce a zero level signal at its output (FIG. 2B). The zero level output sample-and-hold signal propagates through the amplifier chain 110 causing each comparator 112-1, 112-2, ... ,112-n to reset to an inactive state. As a result, when the zero level output sample-and-hold signal reaches the last amplifier stage 110-n, the output of the OR gate 116 goes low terminating the active state of the pulse signal (FIG. 2D).

Thus, as soon as the output sample-and-hold signal that propagates through the amplifier chain 110 in the convert time period exceeds the reference value at the corresponding comparator, the pulse signal becomes active. When the clock signal has been active long enough for the sample and hold output to propagate the entire length of the amplifier chain, then the clock signal returns to the inactive state (a ZERO value) and the sample and hold circuit output becomes inactive. The inactive sample and hold output now propagates through the amplifier chain until it reaches the end of the chain, at which time, the pulse signal will become inactive. Thus, the duration of the pulse signal active period is proportional to the amplitude of the analog input signal supplied to the sample-and-hold circuit 102.

When the clock signal again switches the converter 10 from the sample time period to the convert time period, the converter 10 repeats the above-described analog-to-pulse conversion procedure to generate a pulse, the duration of which is proportional to the amplitude of the analog input signal.

The resolution of the analog-to-pulse converter 10 varies depending on the number of the amplifier stage at which the active state of the pulse signal is initiated. The quantization step of the conversion provided by the analog-to-pulse converter 10 increases as the sample-and-hold signal traverses the amplifier chain 110. When the gain of the amplifier stages in the chain 110 is greater than 1, to initiate the pulse signal active state, an input signal having a smaller amplitude propagates through a larger number of the amplifier stages than an input signal with a higher amplitude. Thus, the resolution of the analog-to-pulse converter 10 is greater for smaller input signals.

Accordingly, the amplifier chain 110 is arranged so as to increase its total gain for a lower level of the input analog signal with respect to its total gain for a higher level of the input analog signal. Thus, the analog-to-pulse converter 10 provides compression of an analog input signal simultaneously with its conversion into a pulse signal. For example, the analog signal compression may prevent analog signal components having small amplitudes from being lost in background.

As discussed above, to provide analog signal compression, the gains of the amplifier stages in the chain 110 are set to be equal with each other and greater than 1. Each comparator 112-1, 112-2, . . . , 112-n may be supplied with the same reference value. Alternatively, the reference value at a comparator 112-i in the comparator set 112 may be made less than the reference value at the preceding comparator 112-(i–1).

In the embodiment of the present invention illustrated in FIGS. 1 and 2A–2D, the delay time caused by the signal propagation through the amplifier chain 110 sets un upper limit on the operating speed of the analog-to-pulse signal converter 10, since the active state of the pulse signal is terminated only after the zero level sample-and-hold signal reaches the last amplifier stage 110-n in the amplifier chain 110. Accordingly, the control clock must be held at its low level until the OR gate 116 is reset.

Figure 3:
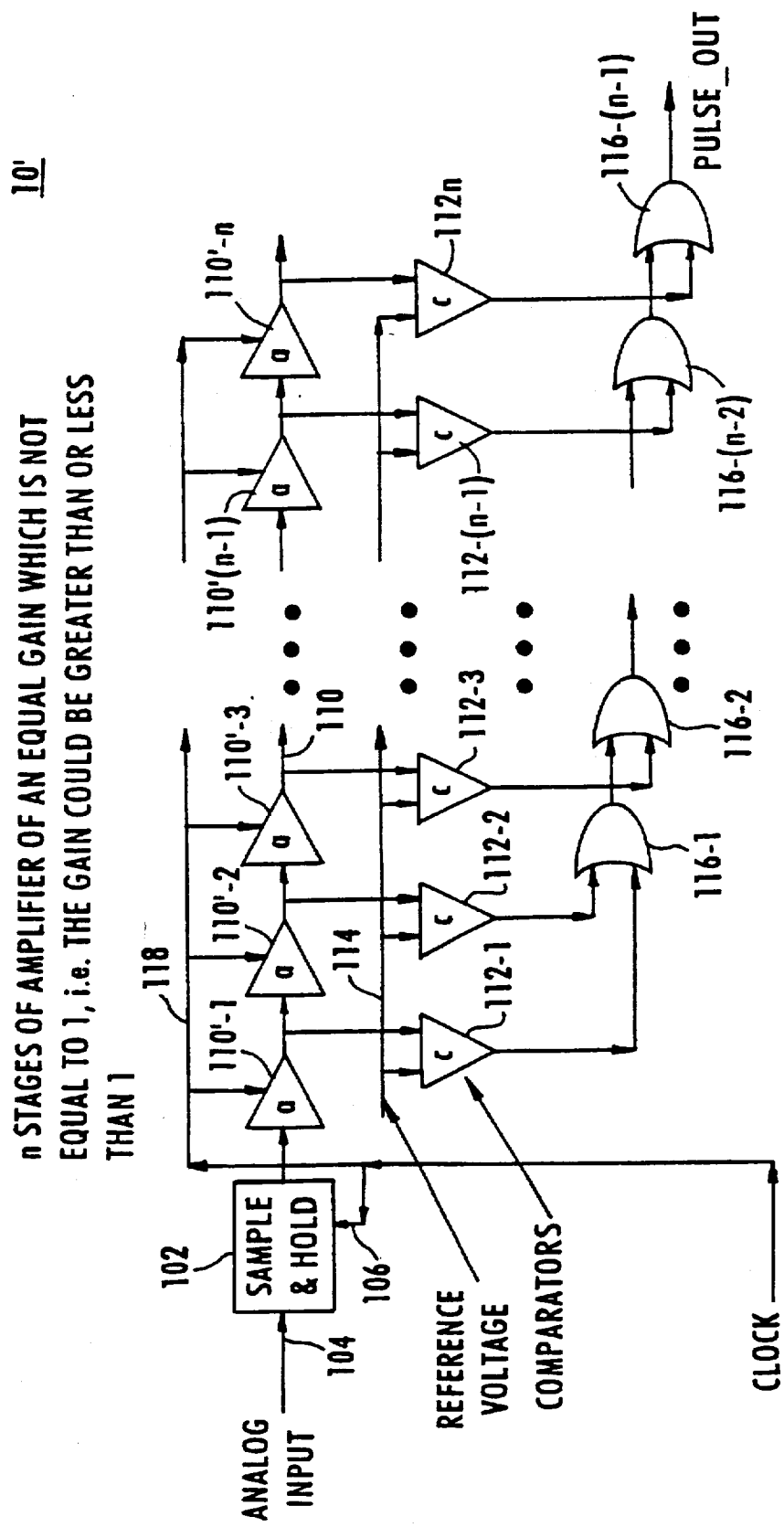
FIG. 3 is a diagram of an analog-to-pulse signal converter according to a second embodiment of the present invention.

Referring to FIG. 3, an analog-to-pulse signal converter 10' according to the alternative embodiment of the present invention allows the operational speed to be increased. In addition to the elements presented in FIG. 1, the converter 10' comprises a clock supply line 118. Further, the logical summing device 116 is composed of OR gates 116-1, 116-2, . . . , 116-(n–1). One input of each OR gate 116-2, . . . , 116-(n–1) is connected to the output of the comparators 112-3, . . . , 112-n, respectively. Another input of each OR gate 116-2, . . . , 116-(n–1) is coupled to the output of the preceding OR gate. The inputs of the first OR gate 116-1 are connected to the outputs of the first two comparators 112-1 and 112-2. The output of the last OR gate 116-(n–1) generates the pulse signal produced by the analog-to-pulse signal converter 10.

Each amplifier stage 110'-1, 110'-2, . . . , 110'-n is provided with a reset input for resetting the output of the amplifier stage to a zero level. The clock supply line 118 is coupled to the reset input of each amplifier stage in the amplifier chain 110. The clock signal is supplied to the control input 106 of the sample-and-hold circuit 102, and via the clock supply line 118, to the reset inputs of the amplifier stages 110-1, 110-2, . . . , 110-n.

As illustrated in FIGS. 4A–4D, the clock supply arrangement enables the converter 10' to increase its operating speed, because the sample time period (FIG. 4C) can be substantially reduced compared to the sample time period shown in FIG. 2C. When the clock signal (FIG. 4C) is switched to its low level, the sample-and-hold circuit is controlled to produce a zero level output sample-and-hold signal (FIG. 4B). Simultaneously, the clock signal supplied to the reset inputs of the amplifier stages 110-1, 110-2, . . . , 110-n resets the outputs of the amplifier stages 110-1, 110-2, . . . , 110-n to a zero level. The zero level outputs of the amplifier stages will cause the sequential inactivation of the respective OR gates 116-1, 116-2, . . . , 116(n–1). This occurs because the first active OR gate in the chain (i.e. the active OR gate that is nearest to the sample and hold output) provides an active input to the next OR gate in the chain, and so on, such that even though the comparator outputs all return to zero when the clock signal inactivation inactivates the amplifier stages, the OR gate chain will take the propagation time of the active portion of the chain to finally allow the pulse output to become inactive. As a result, the time period required for switching the output of the last OR gate 116-(n–1) to a low level (FIG. 4D) is substantially reduced. Accordingly, the duration of the sample time period may be reduced to increase the operating speed of the analog-to-pulse signal converter 10'.

Other aspects of converter 10' operation are similar to the operation of the analog-to-pulse converter 10 in FIG. 1.

There accordingly has been described a circuit that provides conversion of an analog signal into a pulse signal, and simultaneous compression of the analog signal. An input analog signal buffered by a sample-and-hold circuit is supplied to a chain of amplifier stages having equal gains greater than 1. A set of comparators compares the output signal of each amplifier stage with a reference value. As soon as the output of any amplifier stage exceeds the reference value, a logical summing device coupled to the comparators causes a pulse signal produced by the conversion circuit to become active. A clock signal controls the sample-and-hold circuit to produce a zero level sample-and-hold signal that causes the pulse signal to become inactive. As the amplifier chain is arranged so as to increase its total gain for a lower level of the input analog signal with respect to its total gain for a higher level of the input analog signal, the conversion circuit compresses the input analog signal simultaneously with its conversion into the pulse signal.

In this disclosure, there are shown and described only the preferred embodiments of the invention, but it is to be understood that the invention is capable of changes and modifications within the scope of the inventive concept as expressed herein.

What is claimed is:

1. A circuit for converting an input analog signal into a pulse signal and providing simultaneous compression of said input analog signal, comprising:

an amplifier having a plurality of amplifier stages responsive to said input analog signal, a comparator composed of a plurality of comparator units corresponding to said plurality of amplifier stages, each of said comparator units being supplied with an output signal of a corresponding amplifier stage and with a preset reference value, and a pulse generator coupled to an output of each of said comparator units for producing said pulse signal as soon as the output signal of any of said amplifier stages exceeds said preset reference value, to compress said input analog signal simultaneously with producing said pulse signal.

2. The circuit of claim 1, wherein said amplifier stages are connected in series.

3. The circuit of claim 2, wherein said amplifier stages have an equal gain.

4. The circuit of claim 3, wherein a gain of each of said amplifier stages is greater than 1.

5. The circuit of claim 1 further comprising a sample-and-hold circuit coupled to an input of said amplifier.

6. The circuit of claim 5, wherein said sample-and-hold circuit is arranged to be controlled by a control signal to produce a sample-and-hold signal at a low level in a sample time period, and to produce the sample-and-hold signal corresponding to said input analog signal in a convert time period.

7. The circuit of claim 6, wherein said amplifier stages are arranged to sequentially amplify said sample-and-hold signal.

8. The circuit of claim 7, wherein said pulse generator is arranged to initiate generation of said pulse signal in said convert time period when the output signal of any of said amplifier stages exceeds said preset reference value.

9. The circuit of claim 8, wherein said pulse generator is arranged to terminate generation of said pulse signal in said sample time period when output signals of said amplifier stages are less than said preset reference value.

10. The circuit of claim 9, wherein said pulse generator comprises a logical summing circuit having inputs connected to said comparator.

11. The circuit of claim 9, wherein said amplifier stages having reset inputs for receiving said control signal to reset the output signals to a low level.

12. The circuit of claim 1, wherein each of said comparator units has a first input coupled to a reference voltage supply line for receiving a reference voltage, and a second input coupled to an output of an amplifier stage of said amplifier.

13. The circuit of claim 12, wherein said pulse generator is coupled to outputs of said comparator units to initiate generation of said pulse signal when the output signal of any of the amplifier stages exceeds a value of the reference voltage.

14. The circuit of claim 13, wherein said reference voltage supply line is arranged to supply each of said comparator units with an equal value of the reference voltage.

15. The circuit of claim 13, wherein said reference voltage supply line is arranged to reduce the reference voltage supplied to each subsequent comparator unit with respect to the reference voltage at preceding comparator units.

16. A method of converting an analog signal into a pulse signal and providing simultaneous compression of said analog signal, comprising the steps of:

supplying the analog signal to an amplifier composed of multiple amplifier stages arranged to provide sequential amplification of the analog signal, and producing the pulse signal as soon as an output signal of any of the amplifier stages exceeds a preset reference value to compress the analog signal simultaneously with producing the pulse signal.

17. The method of claim 16 further comprising the step of controlling the analog signal before supplying to the amplifier, to produce a low level signal in a sample time period, and to produce a buffered version of the analog signal in a convert time period.

18. The method of claim 17, wherein said pulse signal producing step comprises the step of initiating generation of the pulse signal in the convert time period when the output signal of any of the amplifier stages exceeds the preset reference value.

19. The method of claim 18, wherein said pulse signal producing step comprises the step of terminating generation of the pulse signal in the sample time period when output signals of the amplifier stages are less than the preset reference value.

20. The method of claim 19, wherein said controlling step comprises the step of resetting the amplifier stages carried out simultaneously with producing the low level signal in the sample time period.

* * * * *